US006497824B1

(12) United States Patent
Chen et al.

(10) Patent No.: US 6,497,824 B1
(45) Date of Patent: Dec. 24, 2002

(54) ONE MASK SOLUTION FOR THE INTEGRATION OF THE THIN FILM RESISTOR

(75) Inventors: Chun-Liang A. Chen, Plano, TX (US); Philipp Steinmann, Richardson, TX (US); Stuart M. Jacobsen, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 31 days.

(21) Appl. No.: 09/661,716

(22) Filed: Sep. 14, 2000

Related U.S. Application Data
(60) Provisional application No. 60/156,292, filed on Sep. 23, 1999.

(51) Int. Cl.[7] .............................. B44C 1/22; C23F 1/00; H01L 21/00
(52) U.S. Cl. ............................. 216/16; 216/18; 216/38; 216/39; 216/88; 216/100; 438/692; 438/745; 438/754
(58) Field of Search .............................. 216/16, 18, 38, 216/39, 75, 79, 88, 99, 100; 438/692, 720, 723, 735, 742, 745, 754

(56) References Cited

U.S. PATENT DOCUMENTS

| 5,338,702 A | * 8/1994 | Kobeda et al. | 438/720 X |
| 5,972,788 A | * 10/1999 | Ryan et al. | 438/720 X |
| 6,221,786 B1 | * 4/2001 | Hsu et al. | 438/754 X |

* cited by examiner

Primary Examiner—William A. Powell
(74) Attorney, Agent, or Firm—Jacqueline J. Garner; W. James Brady, III; Frederick J. Telecky, Jr.

(57) ABSTRACT

A method for integrating a thin film resistor (60) into an interconnect process flow. Metal interconnect lines (40) are formed over a semiconductor body (10). An interlevel dielectric (50) is then formed over the metal interconnect lines (40). Conductively filled vias (62) are then formed through the interlevel dielectric (50) to the metal interconnect lines (40). A thin film resistor (60) is then formed connecting between at least two of the conductively filled vias (62) using a single mask step. Connection to the resistor (60) is from below using a via process sequence already required for connecting between interconnect layers (40, 64). Thus, only one additional mask step is required to incorporate the resistor (60).

6 Claims, 2 Drawing Sheets

ONE MASK SOLUTION FOR THE INTEGRATION OF THE THIN FILM RESISTOR

This application claims priority under 35 USC §119(e)(1) of provisional U.S. application No. 60/156,292 filed Sep. 23, 1999.

FIELD OF THE INVENTION

The invention is generally related to the field of thin film resistors in integrated circuits and more specifically to a one mask solution for integrating a thin film resistor into an interconnect process flow.

BACKGROUND OF THE INVENTION

Thin film resistors are utilized in electronic circuits in many important technological applications. The resistors may be part of an individual device, or may be part of a complex hybrid circuit or integrated circuit. Some specific examples of thin film resistors in integrated circuits are the resistive ladder network in an analog to-digital converter, and current limiting and load resistors in emitter follower amplifiers.

Film resistors can comprise a variety of materials including tantalum nitride (TaN), silicon chromium (SiCr), and nickel chromium (NiCr). These resistor materials are generally evaporated or sputtered onto a substrate wafer at a metal interconnect level and subsequently patterned and etched. The thin film resistors require an electrical connection to be made to them. Thus, two mask layers are required. One, TFRES, is to form the resistor itself and the other, TFHEAD, is used to form the resistor "heads" or contact points of the resistor. Connection is made from an overlying metal interconnect layer to the resistor heads. The resistor heads are required to protect the resistor during the via etch needed to make contact between the overlying metal interconnect layer and the resistor. In addition to two masks, multiple deposition and dry/wet etch steps are required to incorporate the resistor.

Morris (U.S. Pat. No. 5,485,138, issued Jan. 16, 1996) describes a method of forming an inverted thin film resistor. The resistor structure is deposited directly on top of the metallic interconnects. The metallic interconnects are formed. An interlevel dielectric layer is deposited over the metallic interconnects and polished back to expose the top surface of the metallic interconnects. The resistor is then formed on a portion of the interlevel dielectric and a portion of the metallic interconnect.

SUMMARY OF THE INVENTION

The invention is a method for integrating a thin film resistor into an interconnect process flow. Metal interconnect lines are formed over a semiconductor body. An interlevel dielectric is then formed over the metal interconnect lines. Conductively filled vias are then formed through the interlevel dielectric to the metal interconnect lines. A thin film resistor is then formed connecting between at least two of the conductively filled vias using a single mask step. Connection to the resistor is from below using a via process sequence already required for connecting between interconnect layer. Thus, only one additional mask step is required to incorporate the resistor.

This and other advantages will be apparent to those of ordinary skill in the art having reference to the specification in conjunction with the drawings.

DETAILED DESCRIPTION OF THE EMBODIMENTS

The following description of the preferred embodiment is merely exemplary in nature and is in no way intended to limit the invention or its application or uses. The present invention discloses a process for manufacturing a thin film resistor in an integrated circuit using a single additional mask.

Figure 1:
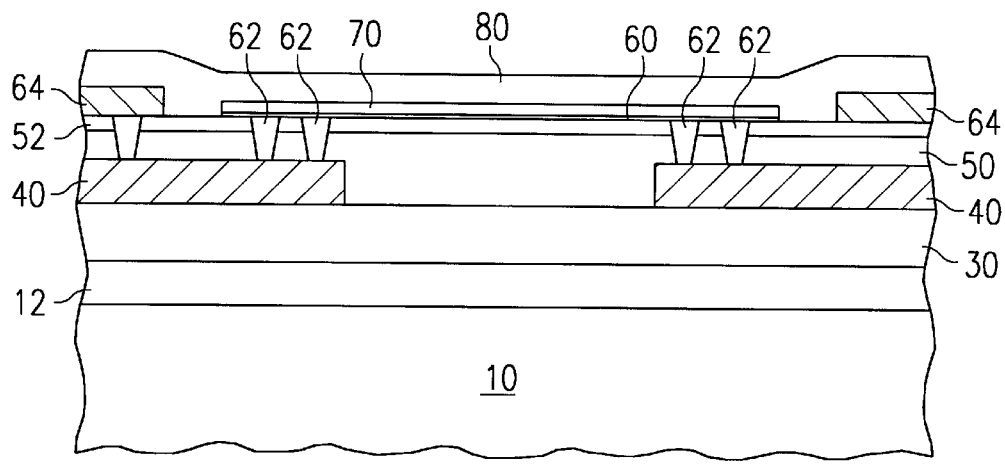
FIG. 1 is a cross-sectional diagram of an integrated circuit having a thin film resistor according to the invention.

A thin film resistor 60 according to the invention is shown in FIG. 1. A first dielectric layer 30 is formed over a semiconductor body 10. Semiconductor body 10 may, for example, comprise a silicon substrate with transistors and other devices formed thereon. Semiconductor body 10 may also include an isolation structure 12 such as field oxide or shallow trench isolation. Thin film resistors are typically formed over the isolation regions of a semiconductor body in order to allow laser trimming-of the resistor.

Lower metal interconnect lines 40 are located over first dielectric layer 30. Lower metal interconnect lines 40 may be part of the first or any subsequent metal interconnect layer except the upper most interconnect layer. Lower metal interconnect layer 40 may, for example, comprise aluminum with appropriate barrier layers. However, other suitable metals are known in the art.

Separating the lower metal interconnect layer 40 and the upper metal interconnect layer 64 is an interlevel dielectric (ILD) 50. ILD 50 may, for example, comprise a spin-on-glass. Other suitable dielectrics, such as HSQ (hydrogen silsesquioxane) or FSG (fluorine doped silicate glass), as well as combinations of dielectrics, are known in the art. A thin dielectric layer 52 is then formed over ILD 50. Dielectric layer 52 may, for example comprise TEOS (tetraethyoxysilane). The thickness of dielectric layer 52 is chosen such that there is an odd number multiple of quarter wavelengths in the dielectric (60,50,30,12). In other words, the distance from the top of the silicon substrate in semiconductor body 10 to the top of dielectric 52 is chosen such that it's physical thickness multiplied by its refractive index is equal to an odd integer number of laser quarter wavelengths. This optimizes the accuracy of the laser for laser trimming of the resistor after processing. Because the actual thickness of ILD 50 varies somewhat, due to deposition and planarization errors, thin dielectric 52 is added after the thickness of ILD 50 is measured. It is much easier to accurately control the deposition thickness of a thinner layer, such as layer 52.

Conductively filled vias 62 extend through dielectric 52 and ILD 50. In the preferred embodiment, conductively filled vias 62 are filled with tungsten. Conductively filled vias 62 are used to connect between either thin film resistor 60 or upper interconnect lines 64 and the lower interconnect lines.

Thin film resistor 60 is located on dielectric 52 and extends to cover and connect between at least two conductively filled vias 62. Connection to resistor 60 is thus made from below resistor 60. Accordingly, resistor heads of the prior art are not required. The material of resistor 60 typically comprises a material such as tantalum-nitride (TaN), silicon-chromium (SiCr), or nickel chromium (NiCr). Resistor 60 may be, for example, 50–2000 Å thick.

Layer 80 is located over the thin film resistor 60 and upper interconnect lines 64. Layer 80 may be a protective overcoat layer if upper interconnect layer is the upper most interconnect layer. Alternatively, layer 80 may be a intermetal dielectric and may have additional interconnect layer formed thereover.

Figure 2A:
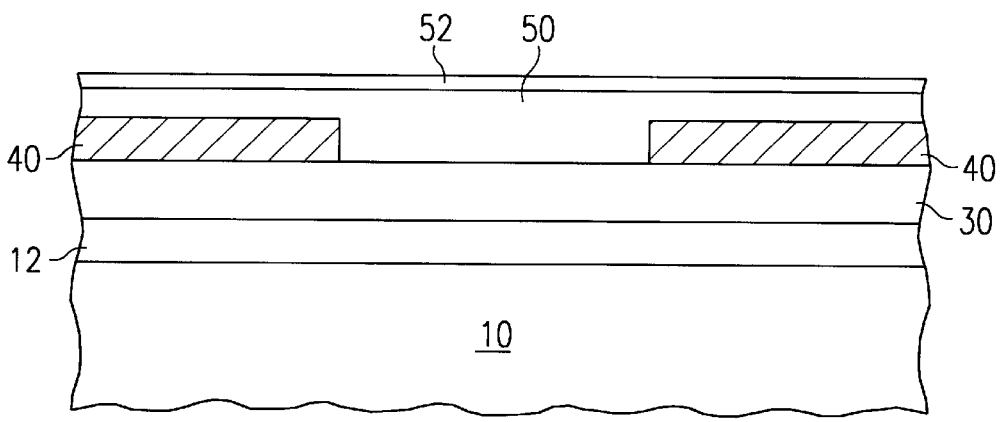
FIGS. 2A–2E are cross-sectional diagrams of the integrated circuit of FIG. 1 at various stages of fabrication.

A method for forming thin film resistor 60 according to the invention will now be discussed with reference to FIGS. 2A–2E. Referring to FIG. 2A, a semiconductor body 10 is provided having an isolation region 12 formed therein. Semiconductor body 10 is typically a silicon substrate processed through the formation of isolation structures 12, transistors, and other devices (not shown). Deposited over semiconductor body 10 is a dielectric layer 30. Dielectric layer 30 may be a PMD (poly-metal dielectric) layer if lower metal interconnect lines are part of the first metal interconnect layer, sometimes referred to as Metal-1. Alternatively, dielectric layer 30 may be an interlevel dielectric layer located between interconnect levels.

Next, a lower metal interconnect lines 40 are formed. Lower metal interconnect lines 40 may, for example, comprise aluminum. Methods for forming metal interconnect layers are well known in the art.

ILD 50 is formed next. ILD 50 is preferably a planarized layer and may be formed in any of a number of ways. Some examples include: deposition followed by CMP (chemical-mechanical-polishing), resist etch back, deposition of a flowable oxide such as HSQ, dep-etch-dep, deposition of a spin-on-glass (SOG) and etchback. Dielectric 50 may be any planarized dielectric suitable for interlevel dielectric layers, such as SOG, BPSG (boron and phosphorous doped silicate glass), PSG (phosphorous doped silicate glass), USG (undoped silicate glass) and HSQ.

After ILD 50 has been formed and planarized, the thickness from the top of ILD 50 and the surface of the silicon in semiconductor body 10 is measured. Thin dielectric layer 52 is then deposited such that the distance from the top of the silicon substrate in semiconductor body 10 to the top of dielectric 52 has a physical thickness, which when multiplied by its refractive index is equal to an odd integer number of laser quarter wavelengths. This optimizes the accuracy of the laser for laser trimming of the resistor after processing. As an example, thin dielectric layer 52 may comprise TEOS.

Figure 2B:
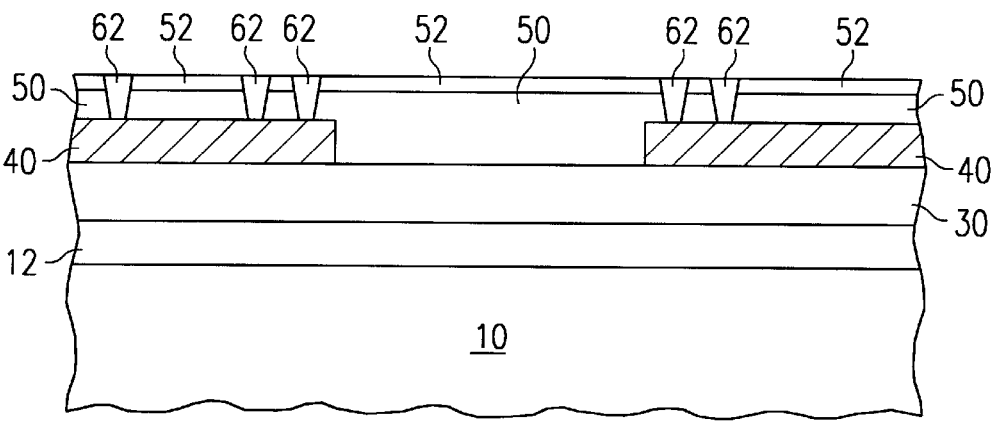

Next, vias 62 are etched through dielectric 52 and ILD 50 to metal interconnect lines 40. Vias 62 are then filled with a conductive material, as shown in FIG. 2B. Vias 62 provide connection to lower metal interconnect lines 40 from subsequently formed upper metal interconnect lines 64 and resistor 60. Vias 62 are conventional vias and methods for forming them are well known in the art. As an example, vias 62 may be filled by depositing tungsten and then chemically-mechanically polishing the tungsten back to planar with the surface of dielectric 52.

Figure 2C:
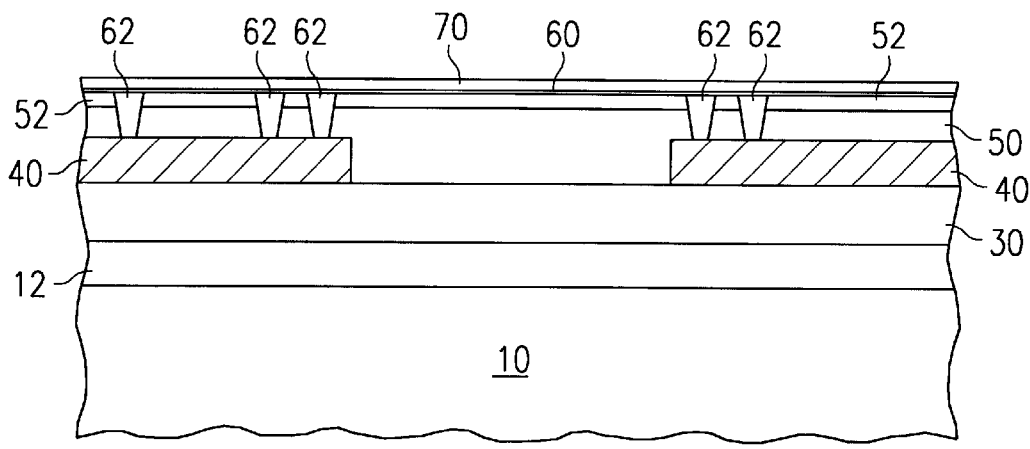
Figure 2D:
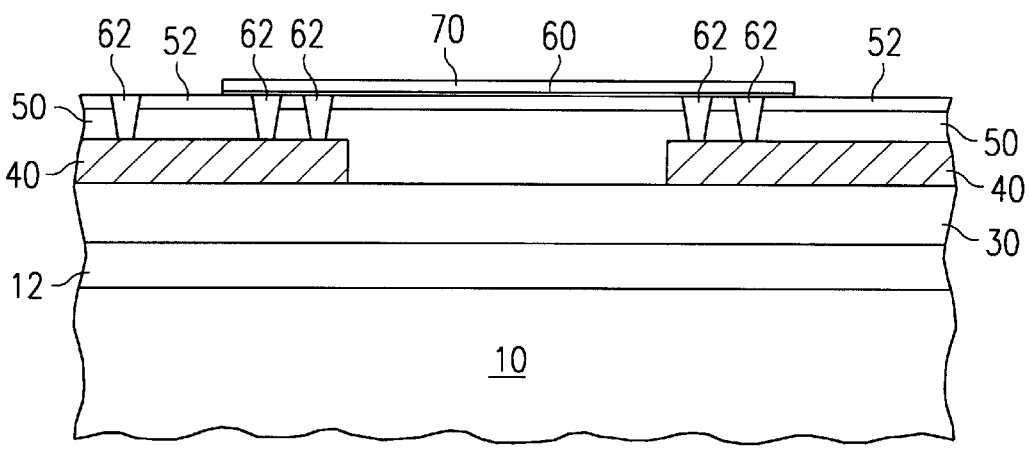

Referring to FIG. 2C, a layer of resistor material 60 is deposited over thin dielectric 52 and vias 62, as shown in FIG. 2C. Suitable materials for resistor material 60 are known in the art, such as TaN, SiCr, or NiCr. As an example, sputter deposition may be used. Resistor material 60 may be, for example, 50–2000 Å thick. Next, a hard mask 70 is deposited over resistor material 60. The function of hard mask 70 is to protect the masked surface of resistor material 60 during the subsequent photoresist patterning and etch step. The thickness of hard mask 70 may be, for example, 1500 Å. Hard mask 70 comprises a dielectric material such as TEOS oxide.

Next, a photoresist mask is formed over hard mask 70. The photoresist mask covers those portions of resistor material 60 that will become the thin film resistor. The exposed portions of hard mask 70 and resistor material 60 are then removed using a suitable etchant or combination of wet and dry etchants. Suitable wet etchants for NiCr, such as ceric sulphate, are known in the art. The photoresist mask is then stripped resulting in the structure of FIG. 2D. After etching, resistor 60 remains in contact with at least two vias 62. Contact with four vias 62 is shown in the figure.

Figure 2E:
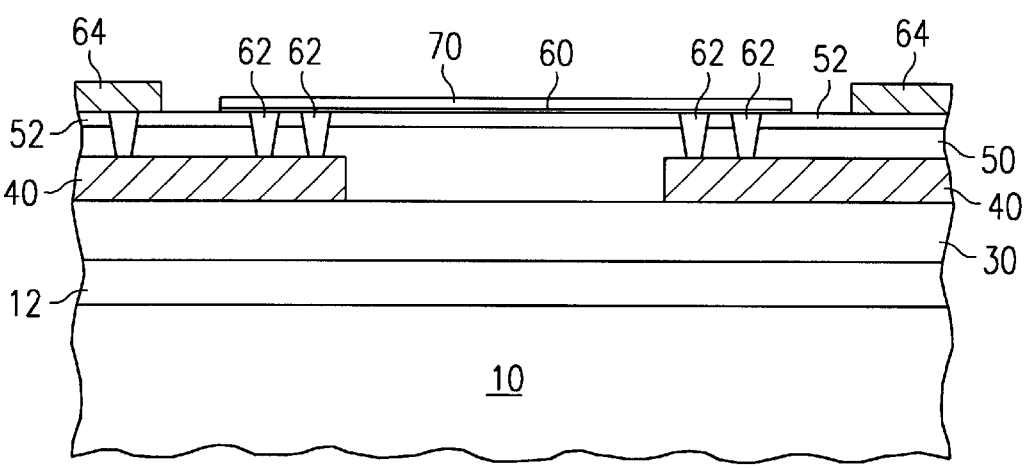

Referring to FIG. 2E, the upper metal interconnect lines 64 are formed over thin dielectric 52. Connection between upper metal interconnect lines 64 and lower metal interconnect lines 40 is also accomplished by several vias 62 as is known in the art. Upper metal interconnect lines 64 may, for example, also comprise aluminum.

Finally, layer 80 is deposited over the device, resulting in the structure shown in FIG. 1. Layer 80 may be a protective overcoat layer if upper interconnect layer is the upper most interconnect layer. Alternatively, layer 80 may be a intermetal dielectric and may have additional interconnect layer formed thereover.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating an integrated circuit, comprising the steps of:
    forming a first metal interconnect layer over a semiconductor body;
    forming a multi-level dielectric over said first metal interconnect layer;
    etching a plurality of vias through said multi-level dielectric to said first metal interconnect layer;
    filling said plurality of vias with a conductive material;
    forming a thin film resistor over a first portion of said multi-level dielectric, including over at least two of said vias; and
    forming a second metal interconnect layer over a second portion of said multi-level dielectric, including over at least one of said vias.

2. The method of claim 1, wherein said conductive material comprises tungsten.

3. The method of claim 1, wherein the step of forming said thin film resistor comprises the steps of:
    depositing a layer of resistor material over said first dielectric;
    depositing a hard mask layer over said layer of resistor material;
    forming a pattern over said hard mask where said thin film resistor is desired;
    etching said hard mask and said layer of resistor material to form said thin film resistor; and
    removing said pattern.

4. The method of claim 3, wherein said hard mask comprises a dielectric materials.

5. The method of claim 3, wherein said hard mask comprises TEOS oxide.

6. The method of claim 1, wherein said step of forming said multi-level dielectric comprises the steps of:

depositing an interlevel dielectric layer over said first metal interconnect layer;

measuring a distance from a top of a silicon substrate in said semiconductor body to a top of said interlevel dielectric; and adding a thin dielectric layer over said interlevel dielectric prior to depositing said layer of resistor material such that said distance plus a thickness of said thin dielectric layer times an index of refraction is approximately equal to an odd integer number of laser quarter wavelengths.

* * * * *